(12) United States Patent
Kang

(10) Patent No.: US 7,327,151 B2
(45) Date of Patent: Feb. 5, 2008

(54) MEMORY APPLICATION TESTER HAVING VERTICALLY-MOUNTED MOTHERBOARD

(75) Inventor: Jong Koo Kang, Suwon (KR)

(73) Assignee: UniTest Incorporation, Yongin, Kyunggi-do (KR)

( * ) Notice: Subject to any disclaimer, the term of this patent is extended or adjusted under 35 U.S.C. 154(b) by 90 days.

(21) Appl. No.: 11/295,607

(22) Filed: Dec. 7, 2005

(65) Prior Publication Data

US 2006/0242468 A1  Oct. 26, 2006

(30) Foreign Application Priority Data

Apr. 20, 2005  (KR)  ...................... 10-2005-0032726

(51) Int. Cl.
    *G01R 31/02* (2006.01)
(52) U.S. Cl. .................................... 324/755
(58) Field of Classification Search .............. 714/42, 714/736; 324/755
    See application file for complete search history.

(56) References Cited

U.S. PATENT DOCUMENTS

| | | | | |
|---|---|---|---|---|
| 5,704,489 A | * | 1/1998 | Smith | ............................ 209/2 |
| 5,705,932 A | * | 1/1998 | Fredrickson | ................ 324/754 |
| 5,986,447 A | * | 11/1999 | Hanners et al. | .......... 324/158.1 |
| 6,178,526 B1 | * | 1/2001 | Nguyen et al. | ................ 714/42 |
| 6,301,167 B1 | | 10/2001 | Lee et al. | |
| 6,415,397 B1 | * | 7/2002 | Co et al. | ........................ 714/42 |
| 6,742,144 B2 | * | 5/2004 | Co | ............................... 714/42 |
| 6,762,615 B2 | | 7/2004 | Lee et al. | |
| 6,771,088 B2 | * | 8/2004 | Kim et al. | ................... 324/765 |
| 6,781,398 B2 | * | 8/2004 | Adler et al. | ................. 324/765 |
| 2002/0056057 A1 | * | 5/2002 | Co | ............................... 714/42 |
| 2004/0078698 A1 | * | 4/2004 | Co et al. | ........................ 714/42 |
| 2005/0028062 A1 | * | 2/2005 | Herrmann et al. | .......... 714/736 |
| 2005/0105350 A1 | * | 5/2005 | Zimmerman | ................ 365/201 |

* cited by examiner

*Primary Examiner*—Jermele Hollington

(57) ABSTRACT

Disclosed is a memory application tester for testing a semiconductor memory device. A plurality of motherboards of the tester are vertically mounted and connected to memory devices to be tested mounted on an interface board via a HiFix board so that a memory application tester may test more memory device simultaneously, and a limit in the trace length due to the integration of the motherboards is effectively solved.

14 Claims, 9 Drawing Sheets

(PRIOR ART)

MEMORY APPLICATION TESTER HAVING VERTICALLY-MOUNTED MOTHERBOARD

RELATED APPLICATIONS

The present disclosure relates to subject matter contained in priority Korean Application No. 10-2005-0032726 filed on 20 Apr. 2005, which is herein expressly incorporated by reference in its entirety.

BACKGROUND OF THE INVENTION

1. Field of the Invention

The present invention relates to a memory application tester, and more particularly, to a memory application tester wherein a motherboard is vertically mounted so as to increase a test throughput.

2. Description of the Related Art

Conventionally, an ATE (Automatic Test Equipment) is used for testing a semiconductor device by applying a certain signal pattern to the semiconductor device and analyzing a signal being output from the semiconductor device to determine a defect of the semiconductor device.

However, since the testing equipment such as the ATE is expensive, a price competitiveness is degraded due to high test cost. Moreover, since the test is carried out in a separate experimental environment rather than in an environment where the semiconductor device is actually installed and used, an accuracy of the test is degraded due to not embodying a property regarding various noises in the actual environment, resulting in an inaccurate determination of defect.

In order to overcome the above-described problems, in case of employing an application test wherein the semiconductor device is actually mounted in an electronic device under the environment where the semiconductor device is actually installed and used, i.e. an application environment is increasing. For example, when a test of a DRAM device used in a PC is carried out, the DRAM module is actually inserted in a motherboard of the PC and a test program according to the actual environment is executed to determine the defect depending on a result of the execution.

An example of the application testing equipment used for the PC is disclosed in Korean Patent Application No. 10-2002-0004428 titled "Semiconductor Memory Testing Equipment" filed on Jan. 25, 2002 by SiliconTech Incorporated. FIG. 1 is a diagram schematically illustrating a conventional memory application tester for testing a memory device packaged by a unit of a module.

As shown in FIG. 1, in accordance with the conventional application tester, a motherboard 110 for PC is horizontally mounted, a surface whereon a CPU 120, a memory controller 130 and a plurality of a memory sockets 140 are mounted faces a downward direction in order to prevent mechanical interference, and a reverse socket 150 (a type of memory socket) corresponding to one of the plurality of the memory sockets 140 is inversely inserted toward an upward direction. An interface board 160 wherein memory module 200 to be tested is mounted is mounted above the motherboard 110, and a handler (not shown) loads the memory module 200 to be inserted in a test socket 170. The test socket 170 is connected to the reverse socket 150 of the motherboard through a connector 180 so as to enable a signal exchange between the memory module 200 and the memory controller 130.

FIG. 2 is a diagram schematically illustrating a conventional memory application tester for testing a memory device by a unit of a component, wherein a test socket 170' is configured to accommodate an individual component loaded by the handler contrary to FIG. 1 and other configuration are similar to FIG. 1.

As described above, in accordance with the conventional memory application tester, a separate interface board is mounted on the horizontally-mounted motherboard so that the memory device may be inserted in the socket by a unit of a module or a component. On the other hand, while a plurality of the motherboards should be mounted to increase a test throughput of the application tester per unit time, each of the motherboards excessively occupies an area horizontally in accordance with the horizontal arrangement structure, and a considerable time is required by the handler to load/unload the memory device.

In order to overcome these problems, the horizontally-mounted motherboards may be vertically stacked. However, a trace length between a motherboard at the bottom layer and the interface board may increase over an allowed limit, resulting in a degradation of reliability of the test result due to system defect. Therefore, in order for the memory application tester to operate properly, the trace length from the memory controller on the motherboard through the reverse socket to the test socket of the interface board and a signal integrity should be accurately maintained.

SUMMARY OF THE INVENTION

It is an object of the present invention to provide an installation structure wherein a plurality of mothrboards are effectively integrated so that a memory application tester may test more memory device simultaneously, and additionally provide a scheme wherein a limit in the trace length due to the integration of the motherboards is effectively solved.

In order to achieve the above-described objects of the present invention, there is provided a memory application tester for testing a semiconductor memory device using motherboards, the tester comprising: a plurality of the motherboards having a memory socket, the plurality of the motherboards being vertically mounted; an interface board disposed above the each of the motherboards, the interface board including a test socket disposed thereon for inserting the semiconductor memory device, and a high-speed connector disposed thereunder being electrically connected to the test socket; and a HiFix board disposed vertically to be in parallel to each of the motherboards, wherein the HiFix board includes a connector for connecting to the memory socket of the motherboard and a socket electrically connected to the connector, wherein the high-speed connector of the interface board is inserted in the socket.

It is preferable that the HiFix board comprises a repeater for terminating a signal path in middle between the semiconductor memory device and the motherboard, and for buffering and relaying a signal therebetween.

DETAILED DESCRIPTION OF THE INVENTION

Embodiments in accordance with the present invention will now be described in detail with reference to the accompanied drawings.

Figure 1:
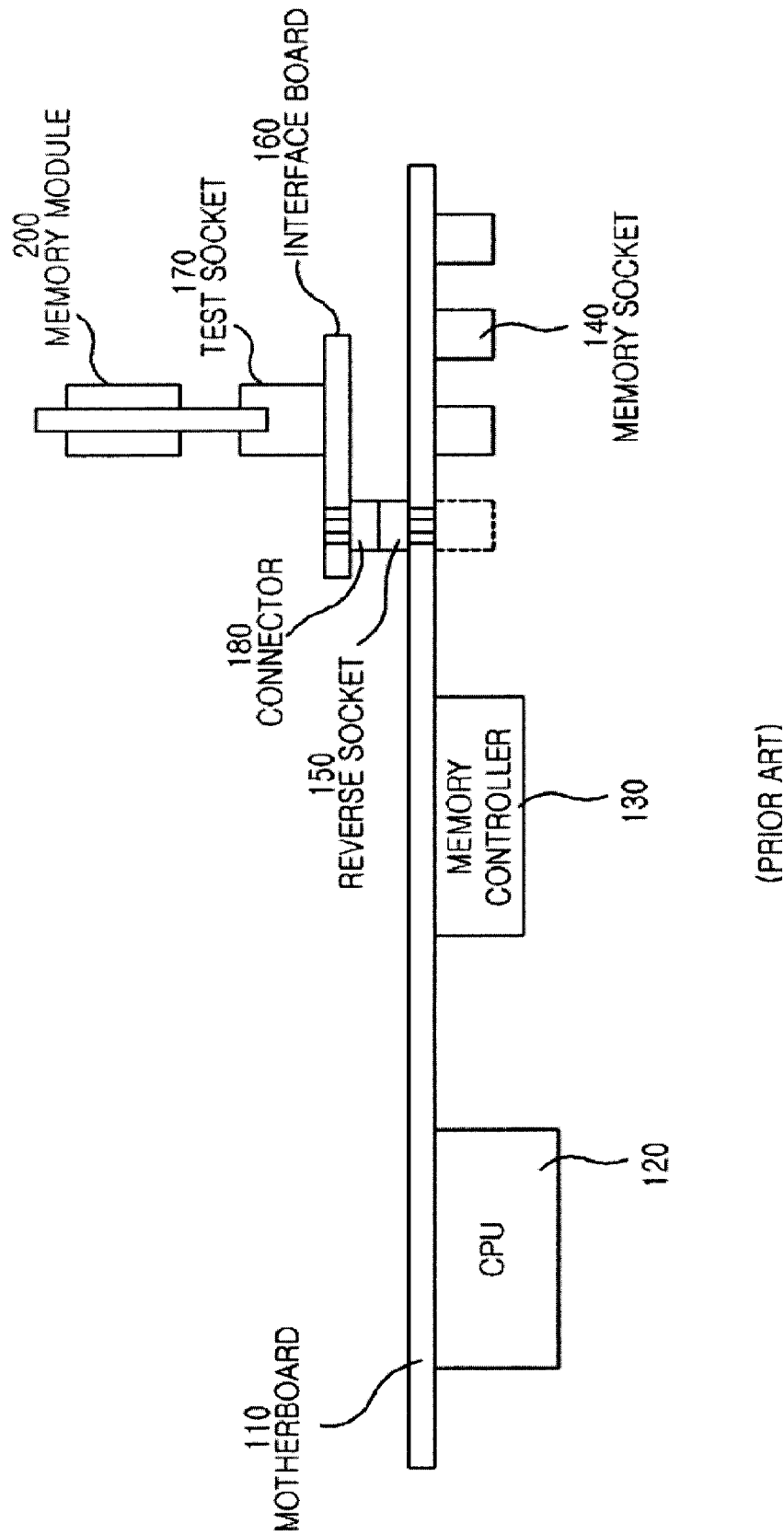
FIG. 1 is a diagram schematically illustrating a conventional memory application tester for testing a memory device packaged by a unit of a module.
Figure 2:
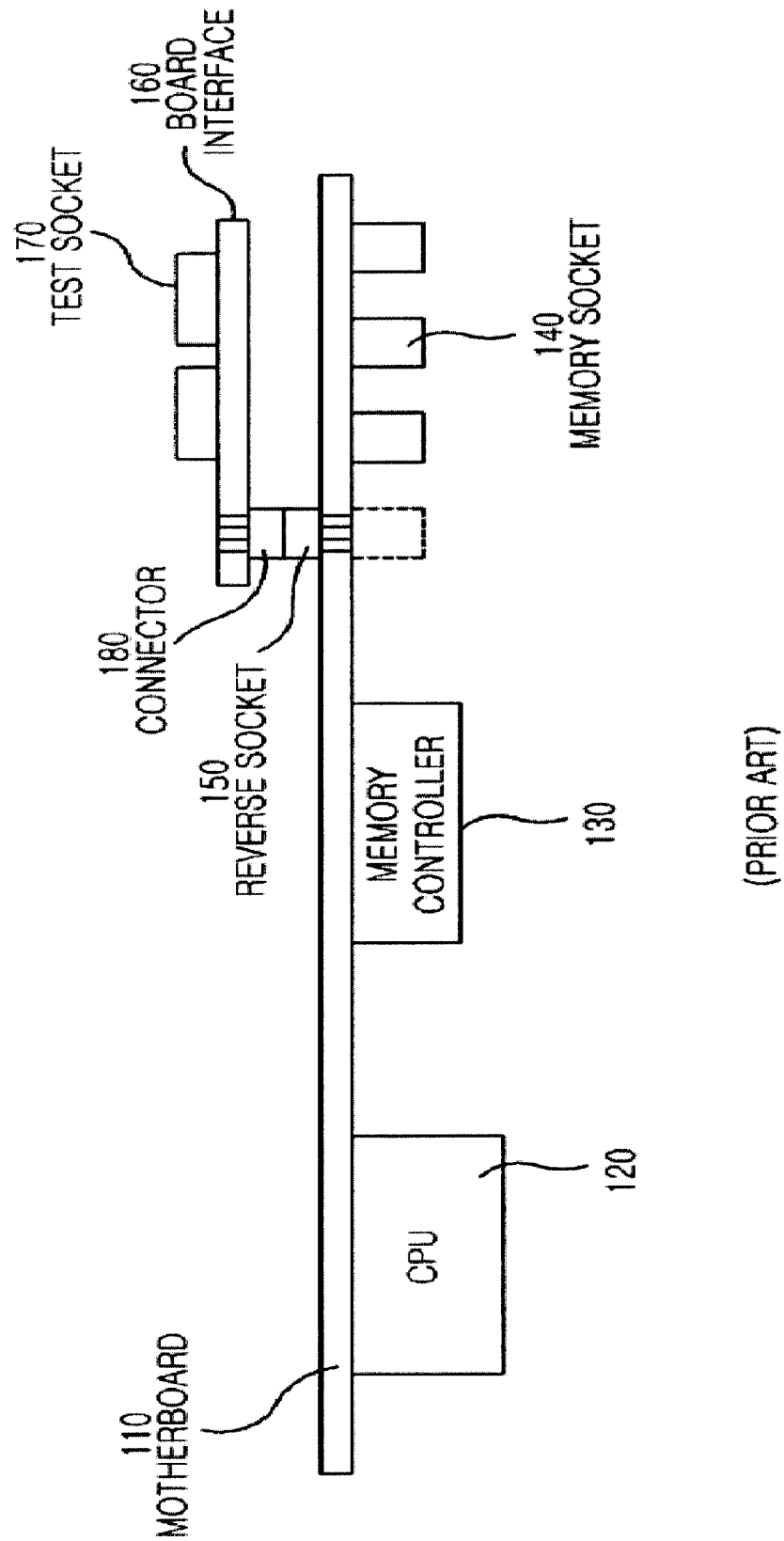
FIG. 2 is a diagram schematically illustrating a conventional memory application tester for testing a memory device by a unit of a component.
Figure 3:
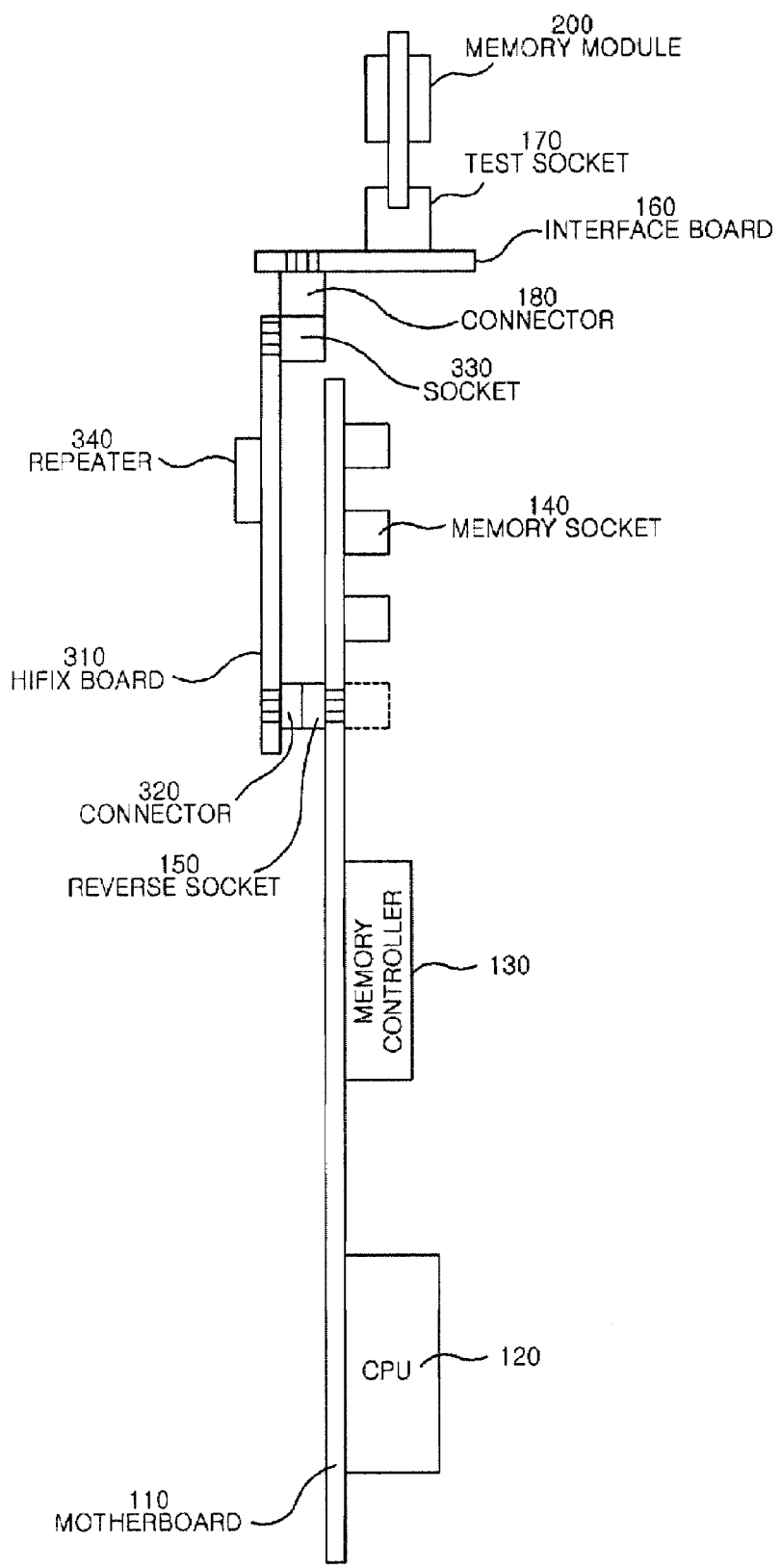
FIG. 3 is a diagram schematically illustrating a configuration of a memory application tester for testing a memory device packaged by a unit of a module in accordance with a preferred embodiment the present invention.
Figure 4:
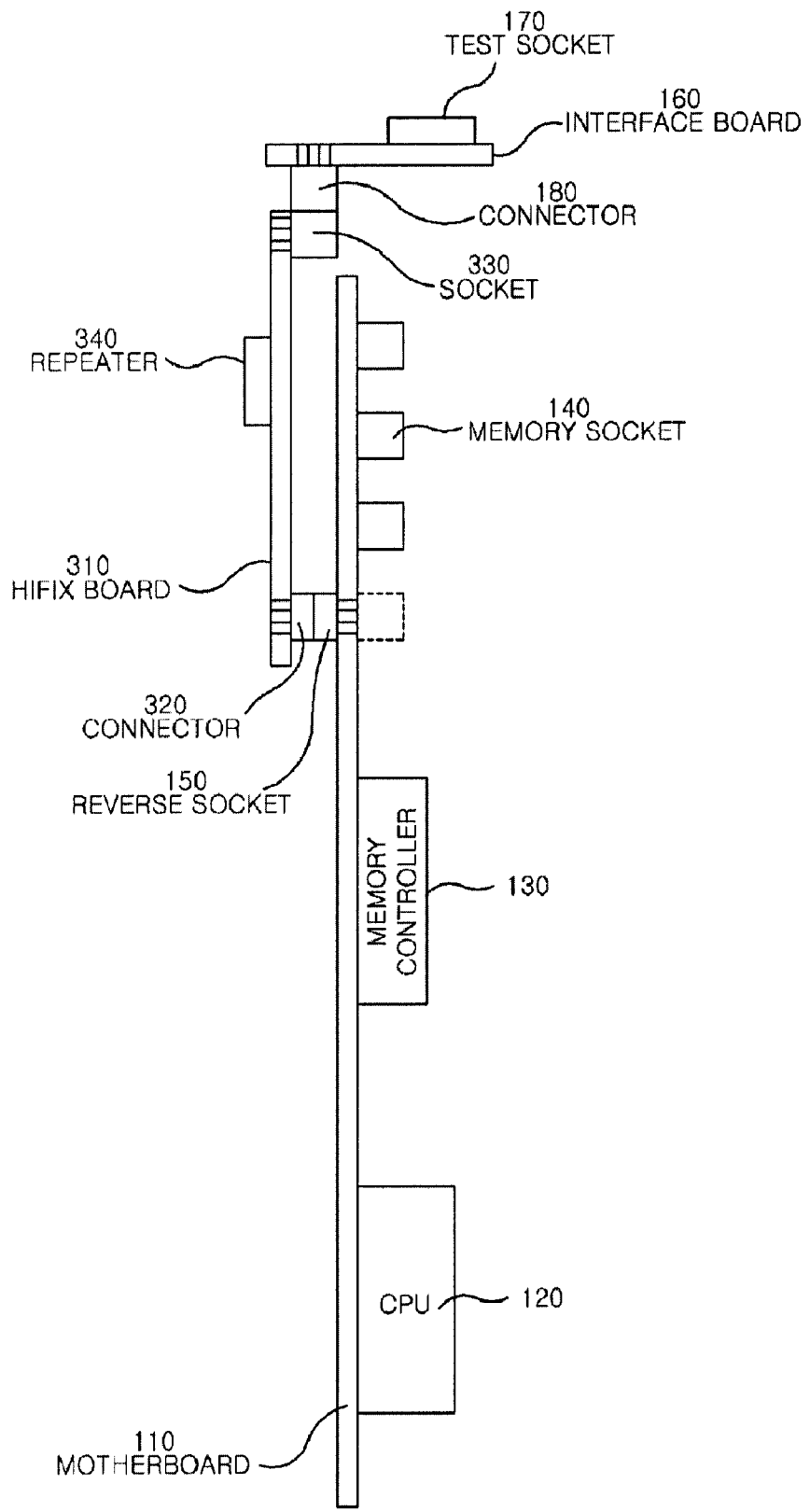
FIG. 4 is a diagram schematically illustrating a configuration of a memory application tester for testing a memory device packaged by a unit of a component in accordance with a preferred embodiment the present invention.

FIGS. 3 and 4 are diagrams schematically illustrating a configuration of a memory application tester for testing a memory device packaged by a unit of a module and of a component in accordance with a preferred embodiment the present invention, respectively.

Referring to FIG. 3, the memory application tester for testing the memory device packaged by the unit of the module comprises a vertically-mounted motherboard 110 wherein a lower portion and side portions may be fixed inside the tester. A chipset such as a CPU 120 and a memory controller 130, a plurality of memory sockets 140 is mounted on a first surface of the motherboard 110. A reverse socket 150 corresponding to one of the plurality of the memory sockets 140 is disposed on a second surface of the motherboard 110 opposite to the first surface. The reason the reverse socket is disposed on the second surface opposite to the first surface where the chipset is mounted is to facilitate a connection of an interface board mechanically, and a socket may be mounted on the first surface where the chipset is mounted if necessary.

The interface board 160 is disposed above the motherboard 110. The interface board 160 includes a test socket 170 disposed on an upper portion of thereof for inserting a memory module 200, and a high-speed connector 180 disposed on a lower portion thereof wherein the high-speed connector 180 is electrically connected to the test socket 170 through a strip line (not shown) of the interface board 160. The high-speed connector refers to a so-called suitable connector generally used for a memory having an operating speed of 400/533/800 MHz. However, the high-speed connector is not limited to be used with the memory having the operating speed of 400/533/800 MHz. The high-speed connector may be a typical connector that is used with memories or devices having other operating speeds.

A HiFix board 310 is for providing a signal path between the motherboard 110 and the interface board 160. The HiFix board 310 is disposed vertically so as to be in parallel to the motherboard. The HiFix board 310 includes a connector 320 disposed on a lower portion thereof for connecting to the reverse socket 150 of the motherboard and an right angle type socket 330 disposed on an upper portion thereof wherein an inserting surface of the connector 330 faces an upward direction so the high-speed connector 180 may be inserted vertically.

The HiFix board 310 comprises a repeater 340 for terminating a signal path in the middle between the connector 320 and the strip line (not shown) connected to the socket 330, and also for buffering and relaying a signal between the motherboard 110 and a memory module 200. A detailed description of the repeater 340 will be given with reference to FIGS. 5 and 6.

Referring to FIG. 4, the memory application tester of FIG. 4 is for testing the memory device packaged by the unit of the component. Therefore, the test socket 170 for inserting the module of FIG. 3 is replaced by a test socket 170' for inserting the component, and a plurality of the test sockets 170' may be mounted according to the number of memory device packaged in a single memory module.

Figure 9:
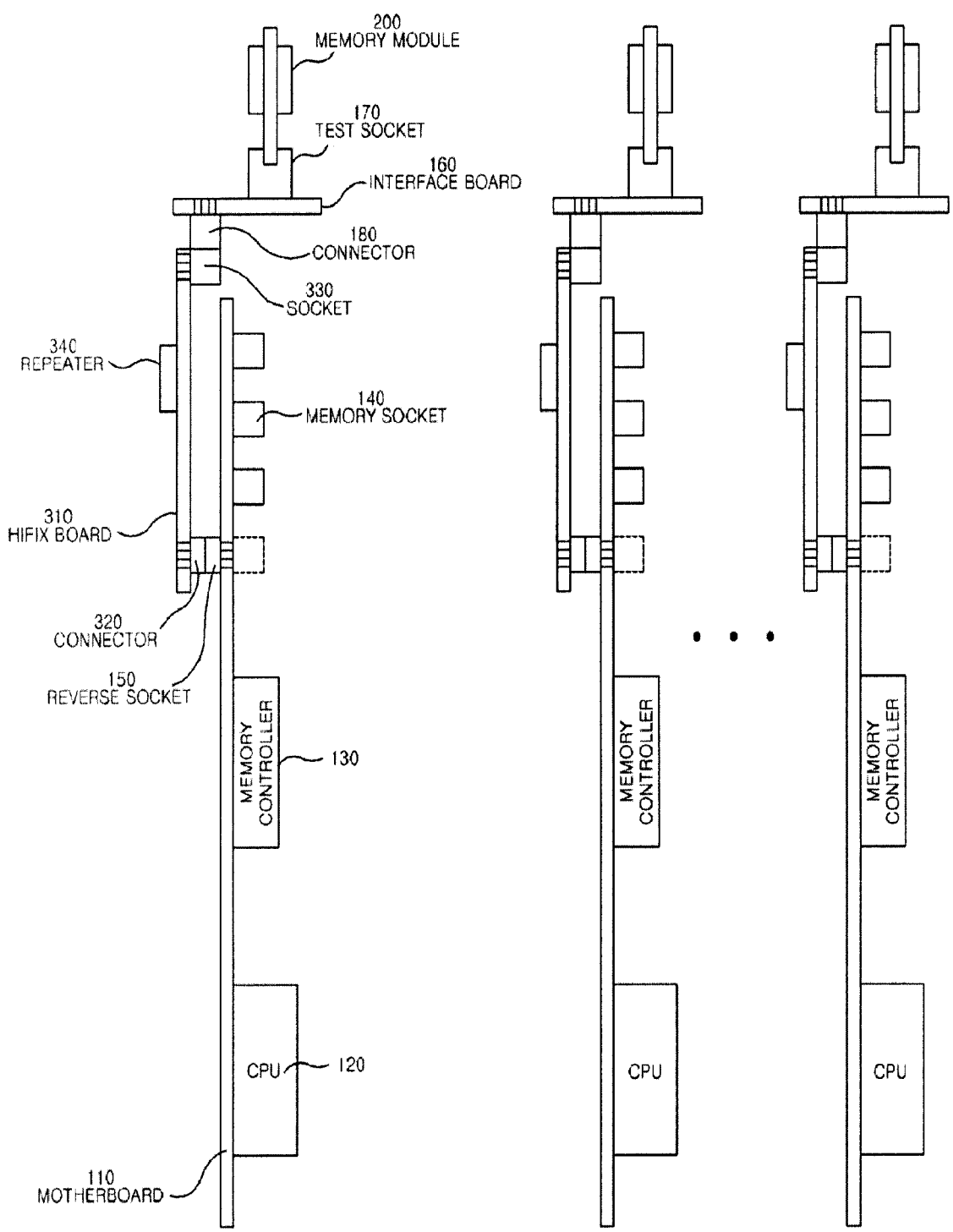
FIG. 9 is diagram illustrating an assembly structure of application tester having a plurality of vertically-mounted motherboards.

On the other hand, while one motherboard and components associated therewith are shown in FIGS. 3 and 4, it should be understood that a plurality of the vertically-mounted motherboard may be arranged in a horizontal direction for expansion as shown in FIG. 9. When the plurality of the motherboards are vertically arranged to configure the tester, each of the motherboards may be connected to a separate tester server through LAN (Ethernet) or a communication line such as RS-232C, and through this configuration, the tester server may collect a test result from each of the motherboards or automatically transmit a command required for a test to each of the motherboards. In addition, the entire test process may be automated through a communication between the test server and a handler.

Figure 5:
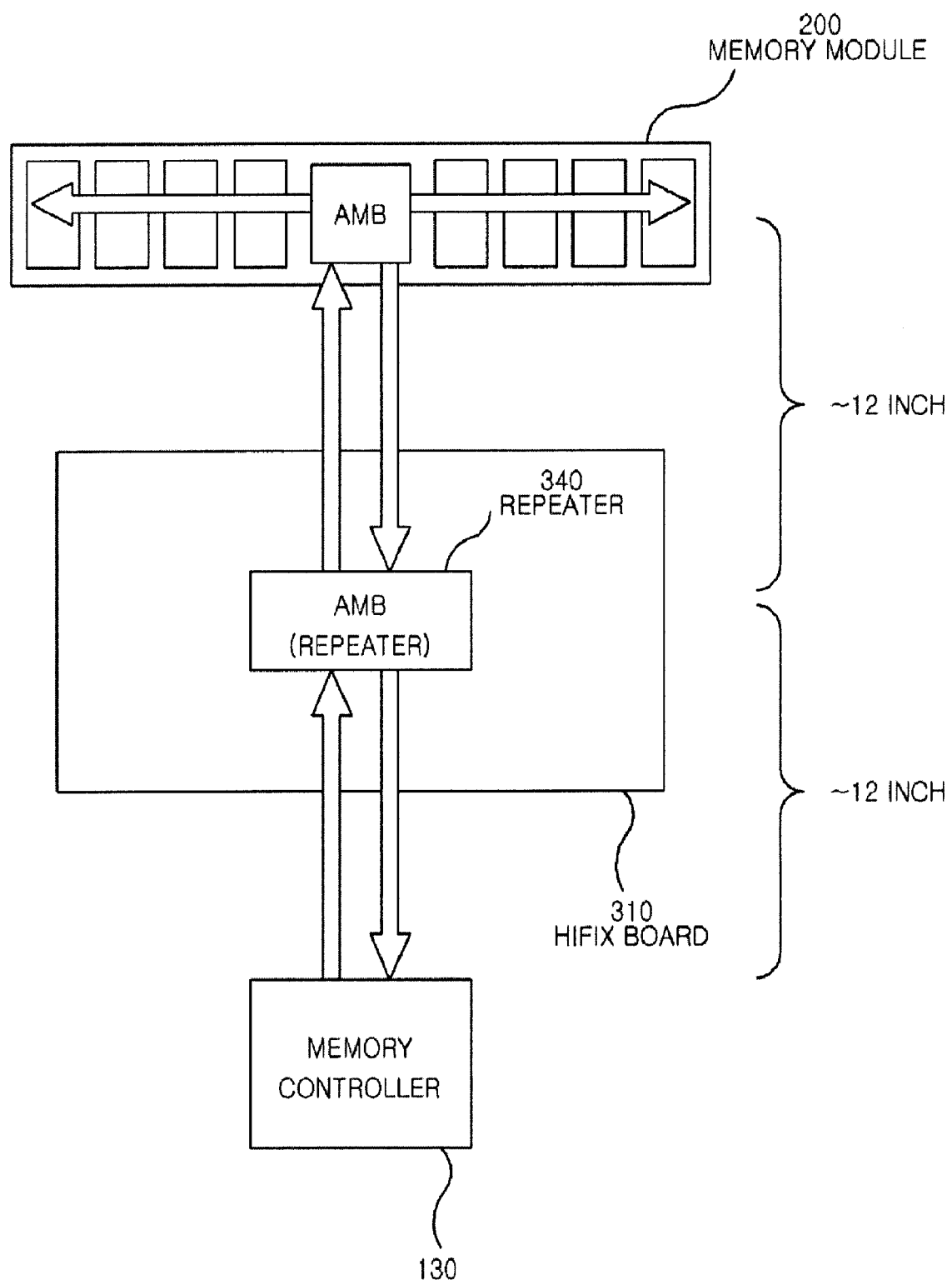
FIG. 5 is a diagram exemplifying a repeater of FIGS. 3 and 4 using a FB-DIMM architecture.

FIG. 5 is a diagram exemplifying a repeater of FIGS. 3 and 4 using a FB-DIMM (Fully Buffered DIMM) architecture proposed by Intel Corporation, wherein a memory module used is a FB-DIMM module.

As shown, the repeater 340 in accordance with a preferred embodiment of the present invention employs an AMB (Advanced Memory Buffer) device defined in the FB-DIMM architecture, and may terminate a signal path between the memory controller 130 and a FB-DIMM module 200' and may be connected to each of the memory controller 130 and the FB-DIMM module 200' within a twelve inch range.

Figure 7:
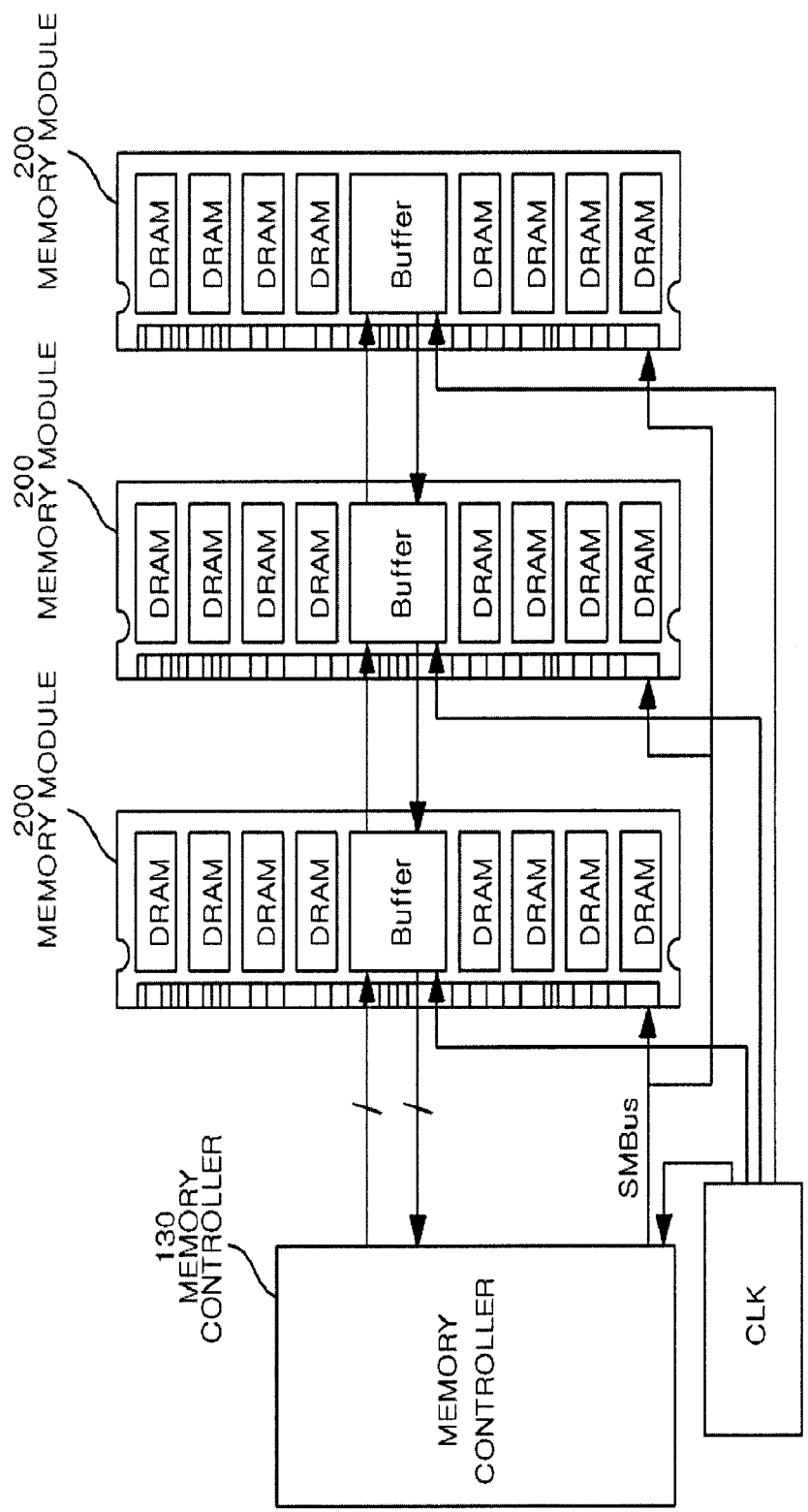
FIG. 7 is a block diagram illustrating a serially connected FB-DIMM module using a point-to-point link function.
Figure 8:
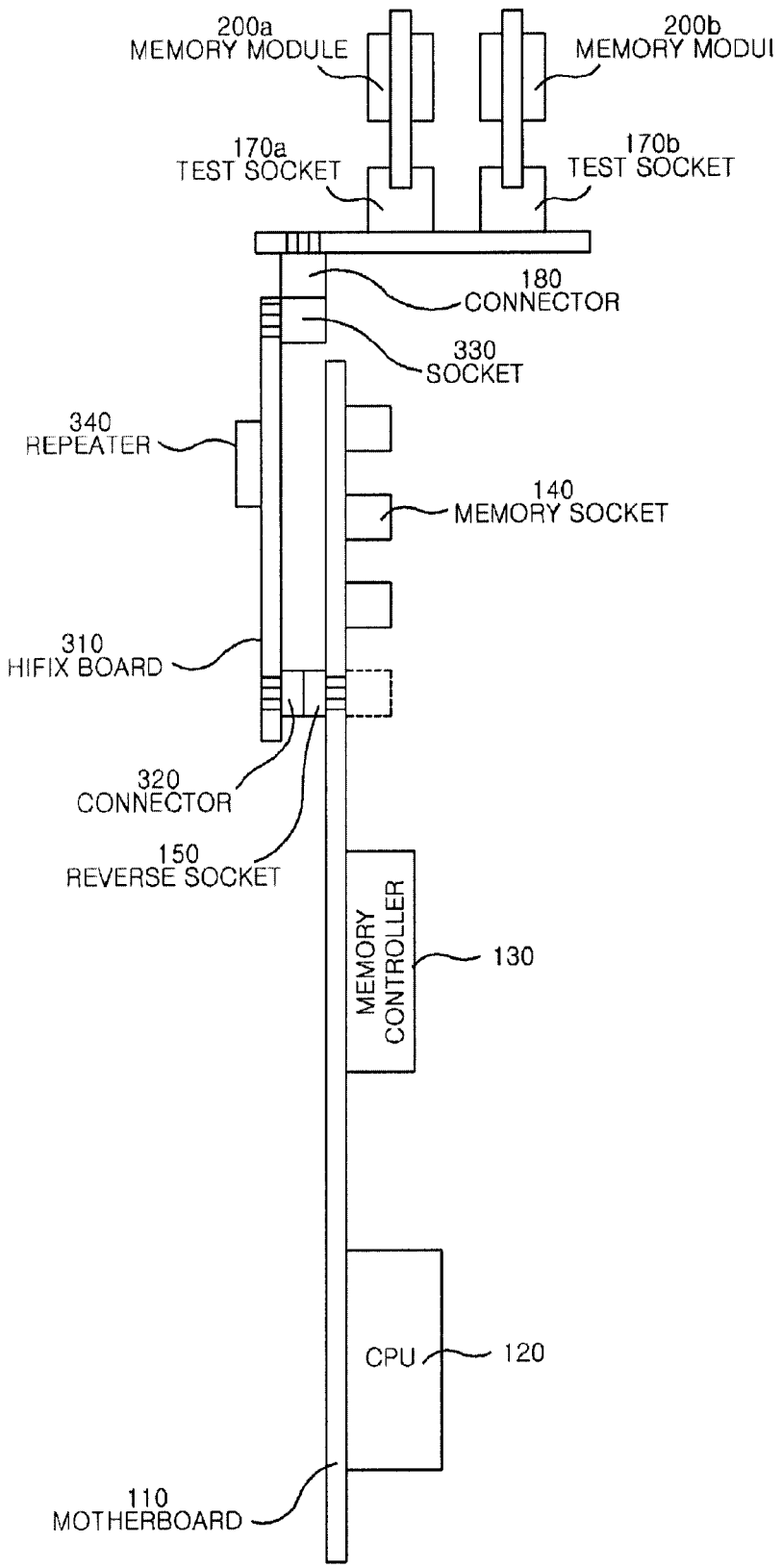
FIG. 8 is a diagram illustrating an assembly structure of application tester for testing a plurality of FB-DIMM modules using a single motherboard.

As shown, the AMB device is mounted on the FB-DIMM module 200' so as to not only relay a signal exchange such as a data, a clock, and a C/A between the memory controller 130 and each memory device of the module but also provide the point-to-point link function wherein a plurality of the FB-DIMM modules may be daisy-chained as shown in FIG. 7. The plurality of the modules may be tested using a single motherboard as shown in FIG. 8 when the point-to-point link function is used.

For the point-to-point link function, the AMB device includes a pass-through logic for transmitting a memory signal to other modules. In accordance with the preferred embodiment of the present invention, a memory signal path of the HiFix board 310 consisting of the strip line is terminated in the middle and the AMB device or a portion thereof is connected to a termination point so that a trace length between the memory controller 130 and FB-DIMM memory module may be doubled. As a result, contrary to the conventional art, a limitation due to the trace length may be eliminated even when the HiFix board is added.

On the other hand, when the FB-DIMM module is used, the memory controller of the motherboard and the test socket 170 of FIG. 3 should support a FB-DIMM interface. In addition, in case of the FB-DIMM module, the memory component tester of FIG. 4 may be used for a test of the AMB component based on an idea that a signal exchange is established between the memory controller and the AMB device. That is, since the AMB device is provided from many logic device manufacturers, it is necessary to test the AMB device prior to an assembly of the AMB device in the memory module. For such a case, the AMB device may be installed in the test socket of FIG. 4 and be tested.

Figure 6:
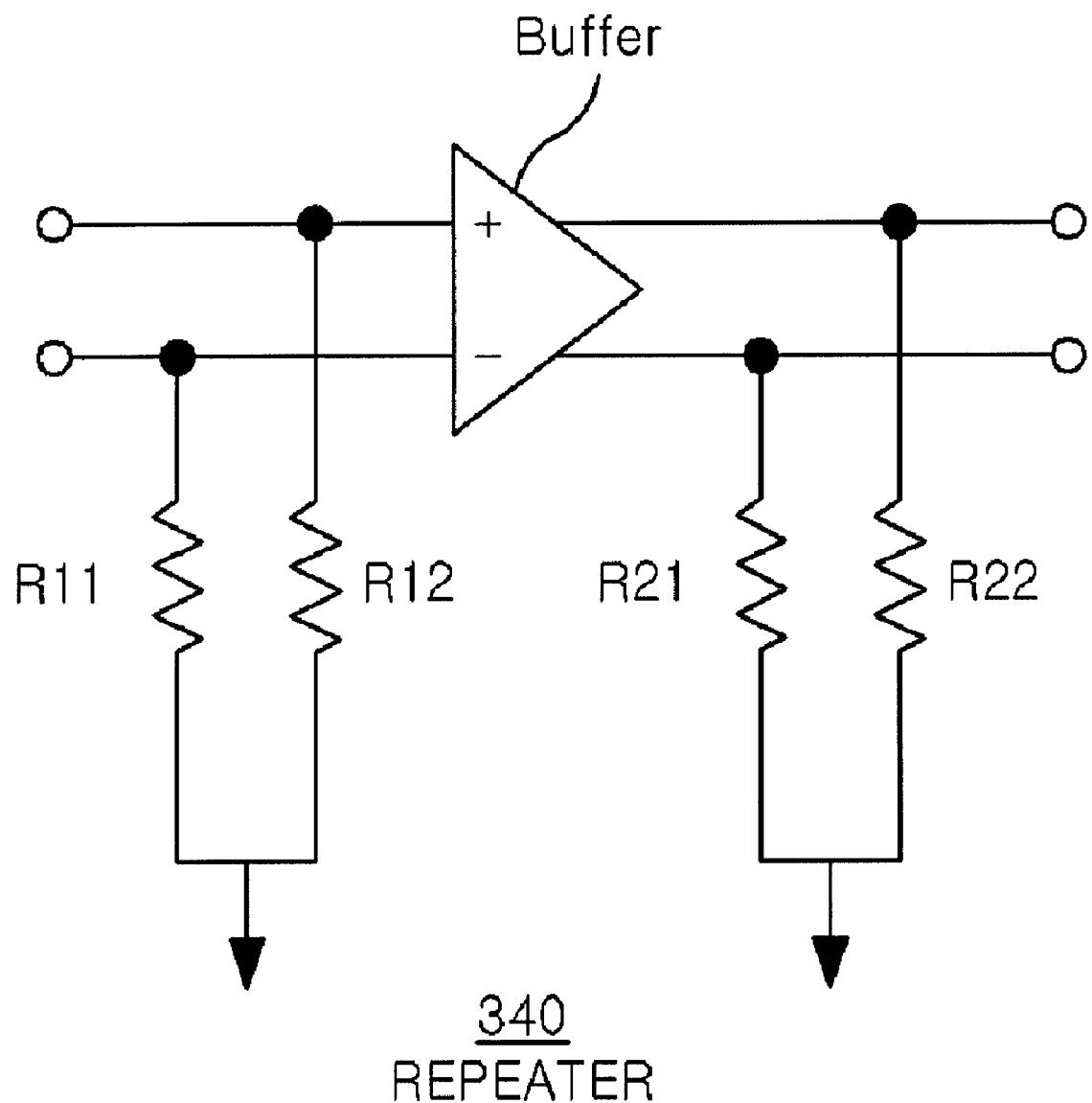
FIG. 6 is a diagram exemplifying a repeater circuit in accordance with a preferred embodiment the present invention.

FIG. 6 is a diagram exemplifying a repeater circuit in accordance with a preferred embodiment the present invention, wherein each memory signal line consists of a differential pair is shown, which can be embodied by the AMB device for example.

As shown, the repeater comprises a buffer for buffering each memory signal being input from one side of the memory controller or the memory module to be output to the other side, and termination resistors $R_{11}$, $R_{12}$, $R_{21}$ and $R_{22}$ respectively connected to an input and an output terminal of the buffer. Since the input and the output terminals forms a separate signal path on the basis of the buffer of the repeater to match impedance, the distance between the memory controller and the memory module may be doubled as described above.

On the other hand, in accordance with the embodiment, a separate reverse socket is inversely inserted. However, the memory socket mounted on the motherboard may be used as is to connect the HiFix board. In addition, the socket and the connector are exemplified as connecting means between the motherboard, the HiFix board and interface board, the socket and the connector may be replaced with equivalent connecting means.

In addition, while the embodiment exemplifies a case where the reverse socket is inversely inserted for one of the plurality of the memory sockets to connect to the HiFix board and interface board, the reverse socket may be inserted for every memory socket to form the signal path for each of the HiFix board and interface board. In this case, a plurality of the repeater corresponding to each signal path may be used or a single repeater supporting a plurality of input/output channels.

While the present invention has been particularly shown and described with reference to the preferred embodiment thereof, it will be understood by those skilled in the art that various changes in form and details may be effected therein without departing from the spirit and scope of the invention as defined by the appended claims.

As described above, in accordance with the present invention, since the plurality of the motherboards are mounted vertically, more motherboards may be integrated in a limited space so that the memory application tester may test more memory device simultaneously. In addition, since a space between the interface boards is decreased due to an improved integration density, the plurality of memory module or component corresponding to the plurality of the motherboards may be simultaneously loaded/unloaded using the handler, and a lead time due to a change of memory module is remarkably reduced.

Moreover, by employing the repeater in the HiFix board added according to the vertical mount of the motherboard, the signal path between the memory controller and the memory module is divided into two. As a result, the trace length between the memory controller and the memory module is doubled at most, and a degradation of reliability due to the addition of the HiFix board is prevented.

What is claimed:

1. A memory application tester for testing a semiconductor memory device using motherboards, the tester comprising:
   a plurality of the motherboards each having a memory socket, the plurality of the motherboards being vertically mounted;
   an interface board disposed above the each of the motherboards, the interface board including a test socket disposed thereon for inserting the semiconductor memory device, and a high-speed connector disposed thereunder being electrically connected to the test socket; and
   a HiFix board disposed vertically to be in parallel to each of the motherboards, wherein the HiFix board includes a connector for connecting the HiFix board to the memory socket of the motherboard and a socket electrically connected to the connector, wherein the high-speed connector of the interface board is inserted in the socket of the HiFix board.

2. The tester in accordance with claim 1, wherein the HiFix board comprises a repeater for terminating a signal path in a middle between the semiconductor memory device and the motherboard, and for buffering and relaying a signal therebetween.

3. The tester in accordance with claim 1, wherein the memory socket of motherboard comprises a reverse socket disposed on a surface opposite to a surface where a motherboard chipset is mounted.

4. The tester in accordance with claim 1, wherein the test socket of the interface board comprises a component socket having a semiconductor memory device inserted therein by a unit of a component.

5. The tester in accordance with claim 4, wherein the test socket of the interface board comprises a socket capable of mounting an AMB device therein.

6. The tester in accordance with claim 1, wherein the test socket of the interface board comprises a module socket for inserting a memory module consisting of packaged semiconductor memory devices.

7. The tester in accordance with claim 6, wherein the test socket of the interface board comprises a socket supporting a FB-DIMM interface.

8. The tester in accordance with claim 7, wherein the interface board comprises a plurality of the test sockets electrically connected to one another.

9. The tester in accordance with claim 2, wherein the memory socket of motherboard comprises a reverse socket disposed on a surface opposite to a surface where a motherboard chipset is mounted.

10. The tester in accordance with claim 2, wherein the test socket of the interface board comprises a component socket having a semiconductor memory device inserted therein by a unit of a component.

11. The tester in accordance with claim 10, wherein the test socket of the interface board comprises a socket capable of mounting an AMB device therein.

12. The tester in accordance with claim 2, wherein the test socket of the interface board comprises a module socket for inserting a memory module consisting of packaged semiconductor memory devices.

13. The tester in accordance with claim 12, wherein the test socket of the interface board comprises a socket supporting a FB-DIMM interface.

14. The tester in accordance with claim 13, wherein the interface board comprises a plurality of the test sockets electrically connected to one another.

* * * * *